United States Patent
Lee (10) Patent No.: US 9,624,574 B2
(45) Date of Patent: Apr. 18, 2017

(54) PLATEN WITH MULTIPLE SHAPED GROUNDING STRUCTURES

(71) Applicant: Varian Semiconductor Equipment Associates, Inc., Gloucester, MA (US)

(72) Inventor: William Davis Lee, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 103 days.

(21) Appl. No.: 14/275,045

(22) Filed: May 12, 2014

(65) Prior Publication Data

US 2015/0322564 A1    Nov. 12, 2015

(51) Int. Cl.
| | | |
|---|---|---|
| H01L 21/683 | (2006.01) | |
| C23C 14/50 | (2006.01) | |
| H01L 21/687 | (2006.01) | |

(52) U.S. Cl.
CPC .......... *C23C 14/50* (2013.01); *H01L 21/6833* (2013.01); *H01L 21/6875* (2013.01)

(58) Field of Classification Search
CPC ... C23C 14/50; H01L 21/68; H01L 21/68742; H01L 21/6875
See application file for complete search history.

(56) References Cited

U.S. PATENT DOCUMENTS

| | | | | |
|---|---|---|---|---|
| 4,553,069 A | * | 11/1985 | Purser .................... | H01J 37/18 250/442.11 |
| 5,179,498 A | * | 1/1993 | Hongoh ............. | H01L 21/6831 269/8 |
| 5,665,167 A | * | 9/1997 | Deguchi ................ | C23C 14/50 118/723 E |
| 6,305,677 B1 | * | 10/2001 | Lenz .................... | H01L 21/6831 269/13 |
| 6,375,749 B1 | * | 4/2002 | Boydston ............. | C23C 16/455 118/728 |
| 6,389,677 B1 | * | 5/2002 | Lenz .................... | H01L 21/6831 269/13 |
| 6,435,798 B1 | * | 8/2002 | Satoh ................... | C23C 16/4586 118/728 |
| 6,711,796 B2 | * | 3/2004 | Su ...................... | H05K 13/0061 269/289 R |
| 6,884,319 B2 | * | 4/2005 | Kim .................... | C23C 16/4581 118/725 |

(Continued)

*Primary Examiner* — Joseph J Hail
*Assistant Examiner* — Tyrone V Hall, Jr.
(74) *Attorney, Agent, or Firm* — Nields, Lemack & Frame, LLC (57) ABSTRACT

A platen having different grounding structures is disclosed. Different grounding structures, such as pins, flat-end posts and mushroom-shaped grounding structures, may be disposed on the surface of a platen. Each type of grounding structure may be advantageously used with a particular type of workpiece. In one embodiment, all of the different grounding structures are mechanically biased upward, such as by springs, from the surface of the platen such that all may contact the back surface of a workpiece disposed on the platen. In another embodiment, one or more actuators are used to lift and lower subsets of the grounding structures such that only a subset of the grounding structures contacts the back surface of the workpiece. These subsets may be all a single type of grounding structure, or may be associated with a particular type of workpiece.

16 Claims, 4 Drawing Sheets

(56) References Cited

U.S. PATENT DOCUMENTS

| | | | |
|---|---|---|---|
| 7,335,090 B2* | 2/2008 | Takahashi | B24B 37/345 414/937 |
| 2003/0151186 A1* | 8/2003 | Witte | B23Q 3/103 269/289 R |

* cited by examiner

FIG. 7B

PLATEN WITH MULTIPLE SHAPED GROUNDING STRUCTURES

FIELD

This disclosure relates to semiconductor platens, and more particularly, platens with multiple grounding structures.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

The workpiece is disposed on a platen while the ion beam is being directed toward the workpiece. The platen serves to hold the workpiece in place. In some embodiments, the platen also serves to remove any charge that collects on the surface of the workpiece during the implantation process. The presence of charge on the workpiece may adversely affect the implantation process. Additionally, the excess charge may make it difficult to remove the workpiece from the platen after the implantation process is completed.

In some embodiments, grounding structures, typically in the form of grounding pins, are used to remove this charge from the workpiece. These pins, which may be grounded, may have a sharp or tapered end that contacts the workpiece. Any charge collected on the workpiece passes through the tapered end and is dissipated.

However, it has been discovered that these grounding pins are not effective with all workpieces. For example, some workpieces have uncoated, or clean, back surfaces, other workpieces have one or more layers, which may be insulating layers, coating the back surfaces, and still other workpieces have back surfaces having additional differences. Different grounding configurations may be more effective for these different types of back surfaces.

Therefore, it would be advantageous if there were a platen that included a plurality of different types of grounding structures, where each type was most effective for a particular type of back surface. Furthermore, it would be beneficial if these different types could be readily employed based on the type of workpiece disposed on the platen.

SUMMARY

A platen having different grounding structures is disclosed. Different grounding structures, such as pins, flat-end posts and mushroom-shaped grounding structures, may be disposed on the surface of a platen. Each type of grounding structure may be advantageously used with a particular type of workpiece. In one embodiment, all of the different grounding structures are mechanically biased upward, such as by springs, from the surface of the platen such that all may contact the back surface of a workpiece disposed on the platen. In another embodiment, one or more actuators are used to lift and lower subsets of the grounding structures such that only a subset of the grounding structures contacts the back surface of the workpiece. These subsets may be all a single type of grounding structure, or may be associated with a particular type of workpiece.

In one embodiment, a platen for holding a workpiece is disclosed. The platen comprises a surface on which the workpiece is disposed; and a plurality of different grounding structures extending from the surface toward a back surface of the workpiece; wherein the plurality comprises a first grounding structure and a second grounding structure, different from the first grounding structure. In a further embodiment, the first grounding structure comprises a grounding pin having a tapered end configured to penetrate the back surface of the workpiece. In another embodiment, the second grounding structure comprises a flat end configured to contact the back surface.

In another embodiment, a platen for holding a workpiece is disclosed. The platen comprises a surface on which the workpiece is disposed; a plurality of grounding structures, comprising a first subset of grounding structures and a second subset of grounding structures, the second subset different from the first subset; and an actuator, in communication with the first subset of grounding structures, to move the first subset of grounding structures from a first position where the first subset does not contact a back surface of the workpiece to a second position where the first subset is extended above the surface so as to contact the back surface, and also in communication with the second subset of grounding structures, to move the second subset from a first position where the second subset does not contact the back surface of the workpiece to a second position where the second subset is extended above the surface so as to contact the back surface.

In another embodiment, a platen for holding a workpiece is disclosed. The platen comprises a surface on which the workpiece is disposed; a plurality of grounding structures, comprising a first subset of grounding structures; and a second subset of grounding structures, the second subset different from the first subset; a first actuator, in communication with the first subset of grounding structures, to move the first subset of grounding structures from a first position where the first subset does not contact a back surface of the workpiece to a second position where the first subset is extended above the surface so as to contact the back surface; and a second actuator, in communication with the second subset of grounding structures, to move the second subset from a first position where the second subset does not contact the back surface of the workpiece to a second position where the second subset is extended above the surface so as to contact the back surface. In a further embodiment, the first subset of grounding structures comprises only grounding pins having a tapered end configured to penetrate the back surface of the workpiece. In another further embodiment, the second subset of grounding structures comprises only grounding structures having a flat end configured to contact the back surface. In another further embodiment, the first subset of grounding structures and the second subset of grounding structures are configured for a particular type of workpiece.

BRIEF DESCRIPTION OF THE DRAWINGS

For a better understanding of the present disclosure, reference is made to the accompanying drawings, which are incorporated herein by reference and in which.

DETAILED DESCRIPTION

As described above, in some embodiments, it may be desirable to remove excessive built-up charge from the surface of a workpiece. However, a single type of grounding structure may not be optimal for all workpieces.

For example, in one embodiment, a workpiece, such as a silicon workpiece, may develop a thin layer of oxide on all of its surfaces. This thin silicon oxide layer, referred to as a native oxide layer, may be insulating in nature. Therefore, to properly remove the charge from the workpiece, it may be beneficial to pierce this thin layer, so that the grounding structures contact the underlying silicon workpiece, which is semi-conductive.

Figure 1:
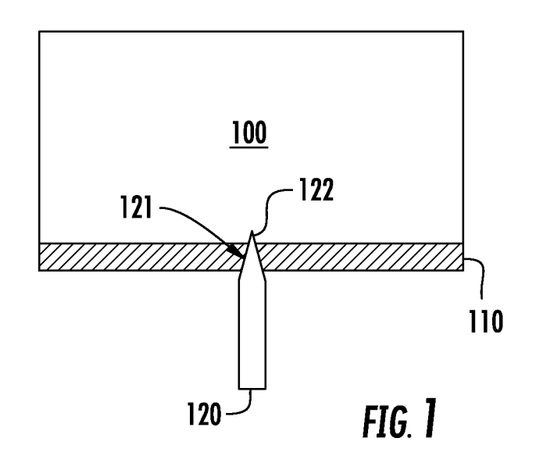
FIG. 1 shows a cross-sectional view of a grounding pin used with a workpiece having a native oxide layer.

FIG. 1 shows a cross-section view of a workpiece 100, having a thin oxide layer 110 disposed on at least its back surface. The workpiece 100 may be a silicon substrate and the oxide layer 110 may be silicon oxide. This silicon oxide layer 110 may have a thickness of about 70 angstroms. A grounding structure 120, also known as a grounding pin, is used to pierce the thin oxide layer 110 and contact the underlying workpiece 100. To do this, the grounding structure 120 may have a tapered end 121 terminating in a tip 122, which is able to penetrate the oxide layer 110. The tip 122 of the grounding structure 120 may have a radius of 2 µm. Since the grounding structure 120 is made of a conductive material, such as tungsten, titanium, aluminum, molybdenum, conductive polymer or other suitable materials, it is able to dissipate the excess charge, even though only a small cross-sectional area of the grounding structure 120 actually contacts the workpiece 100.

In other embodiments, the workpiece may be coated with one or more layers on its back surface. At times, these layers may be insulating. For example, in some embodiments, an oxide layer is thermally grown on the workpiece. This grown oxide layer may have a thickness much greater than a native oxide layer, such as between 100 and 10000 angstroms.

Figure 2:
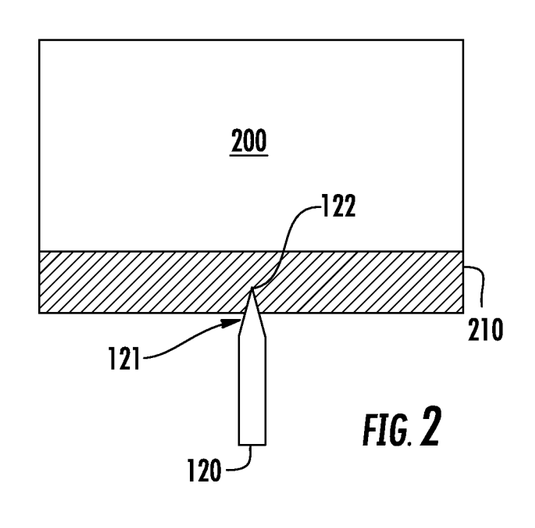
FIG. 2 shows a cross-sectional view of a grounding pin used with a workpiece having a grown oxide layer.

FIG. 2 shows a cross-sectional view when the grounding structure 120 of FIG. 1 is used with a workpiece 200 having a grown oxide layer 210. Since this grown oxide layer 210 is much thicker than the native oxide layer, shown in FIG. 1, the grounding structure 120 is unable to penetrate the grown oxide layer 210. In this configuration, the grown oxide layer 210 behaves as a resistor in the path between the workpiece 200 and the grounding structure 120. The resistance of the grown oxide layer 210 can be calculated as follows:

$$R = \rho * T/A,$$

Where R is the resistance, ρ is the resistivity of the grown oxide layer 210, T is the thickness of the grown oxide layer 210, and A is the cross-sectional area of the grounding structure 120 in contact with the grown oxide layer 210. Therefore, for a given thickness of grown oxide layer 210, the resistance is largely determined by the cross-sectional area of the grounding structure 120 in contact with the grown oxide layer 210.

In other words, the tapered end 121 of the grounding structure 120, which was beneficial when used with thin oxide layers, actually increases the resistance between the workpiece and the grounding structure when a thicker oxide layer is disposed on the back surface of the workpiece.

Figure 3:
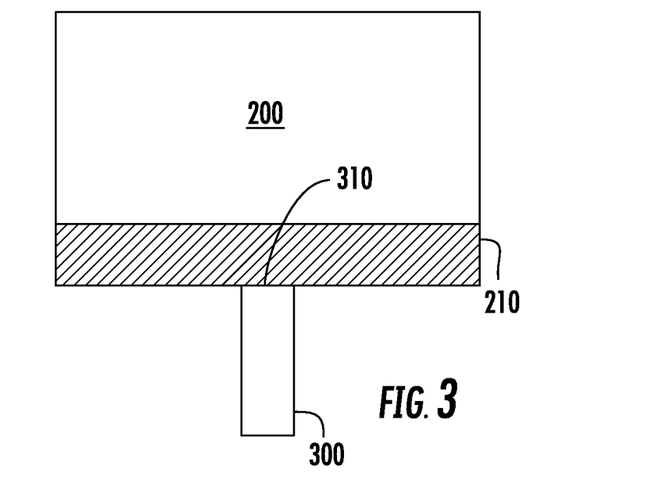
FIG. 3 shows a cross-sectional view of a flat-end post grounding structure used with a workpiece having a grown oxide layer.
Figure 4:
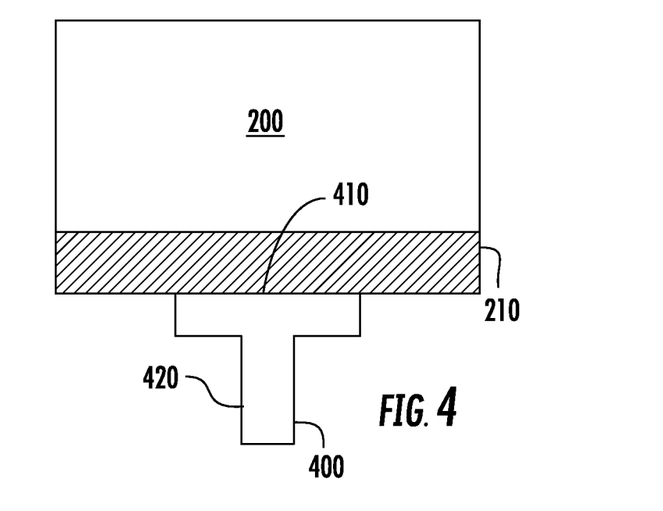
FIG. 4 shows a cross-sectional view of a mushroom-shaped grounding structure used with a workpiece having a grown oxide layer.

FIG. 3 shows a cross-sectional view of a workpiece 200 having a thicker grown oxide layer 210 used with a second type of grounding structure 300. This grounding structure 300 has a flat end 310, which greatly increases the contact region between the grounding structure 300 and the grown oxide layer 210. This may be referred to as a flat-end grounding post. This flat end 310 may have a diameter between 0.1 mm and 3 mm, for example. Based on the equation above, any increase in the cross-sectional area of the flat end 310 of the grounding structure 300 may result in a corresponding decrease in the resistance through the grown oxide layer 210 that is disposed between the workpiece 200 and the grounding structure 300. In another embodiment, shown in FIG. 4, the flat end 410 of the grounding structure 400 has a cross-sectional area greater than that of the body 420 of the grounding structure 400. This may be referred to as a mushroom-shaped grounding structure. In yet another embodiment, the grounding structure may have a knurled top surface.

Figure 5:
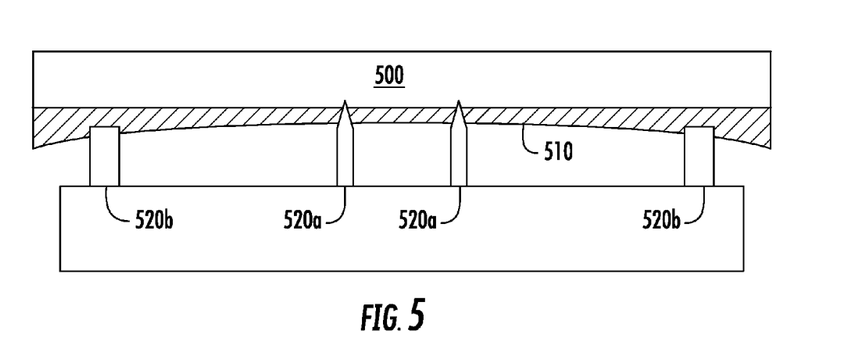
FIG. 5 shows a cross-sectional view of a plurality of grounding structures with a workpiece having a nitride layer.

While the previous discussion described thicker grown oxide layers, other coatings are also possible. For example, in some embodiments, a nitride layer may be disposed on the workpiece. In some embodiments, nitride layers are known to have a thickness gradient, where the thickness of the nitride layer may be thicker near the edges, or periphery, of the workpiece and may decrease approaching the center of the back surface. In this embodiment, a single type of grounding structure may not be optimal. For example, the grounding pins of FIG. 1 may be effective near the center of the back surface, while the flat-end grounding posts of FIG. 3 or the mushroom-shaped grounding structures of FIG. 4 may be more appropriate near the edges of the workpiece. FIG. 5 shows a workpiece 500 with a non-uniform nitride coating 510. In this embodiment, some of the grounding structures are grounding pins 520a, and some of the grounding structures are flat-end grounding posts 520b. Alternatively, mushroom-shaped grounding structures may be used along the outer edge of the workpiece 500.

The coating non-uniformity shown in FIG. 5 may occur in other instances as well. For example, in some embodiments, a coating may be applied to the front side of the workpiece. During the application of this coating, some of the material may be deposited on the back surface of the workpiece. For example, that deposition may be more concentrated near the outer edge, or periphery of the workpiece, and less concentrated near the center of the workpiece, although other configurations are also possible.

These various types of grounding structures may all be incorporated into a single platen. In one embodiment, shown in FIG. 6, a plurality of different grounding structures 600 extend upward from the surface 620 of the platen 610. This plurality of different grounding structures 600 includes at least a first grounding structure and a second grounding structure, different than the first grounding structure. For example, the first grounding structure may comprise grounding pins, which are suitable for workpieces with a native oxide layer on the back surface, or some other grounding structure. The second grounding structure may be flat-end posts, mushroom-shaped grounding structures or grounding structures with knurled top surfaces. Of course, other types of grounding structures are also possible and are within the scope of the disclosure.

The use of different grounding structures allows improved contact with the workpiece, regardless of the type or thickness of coating that is present on the back surface of the workpiece. As stated above, grounding pins may be used with workpieces having thin coatings, while other types of grounding structures may be used with workpieces having thicker coatings. A combination of different grounding structures may be used when a workpiece has a non-uniform coating on its back surface.

Figure 6:
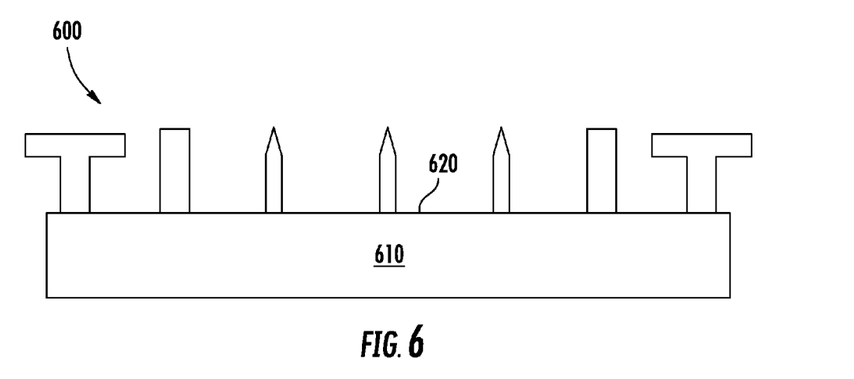
FIG. 6 shows a platen with a plurality of different grounding structures.

The plurality of different grounding structures 600 may be mechanically biased upward from the surface 620 of the platen 610 to contact the back surface of a workpiece. In one embodiment, the grounding structures 600 are mechanically biased upward by springs or other biasing members.

In some embodiments, the tops of all of the different grounding structures 600 extend to the same level above the surface 620 of the platen 610. In another embodiment, the grounding pins are slightly taller than the other grounding structures to allow the grounding pins to contact the oxide layer first and to pierce the oxide layer. In another embodiment, the grounding pins may be slightly shorter than the other grounding structures to insure that the large ends of the other grounding structures make sufficient contact with the back surface of the workpiece.

Figure 7A:
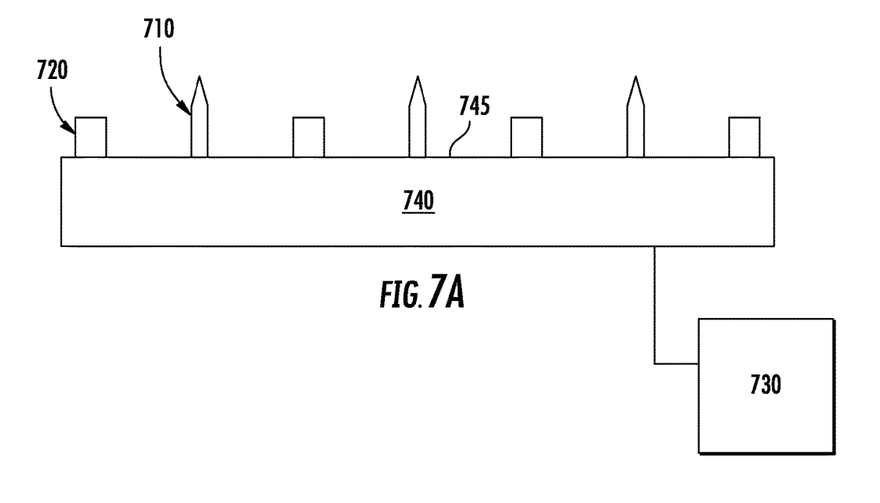
FIG. 7A-7B show a cross-sectional view of a platen having two subsets of grounding structures controlled with an actuator.
Figure 7B:
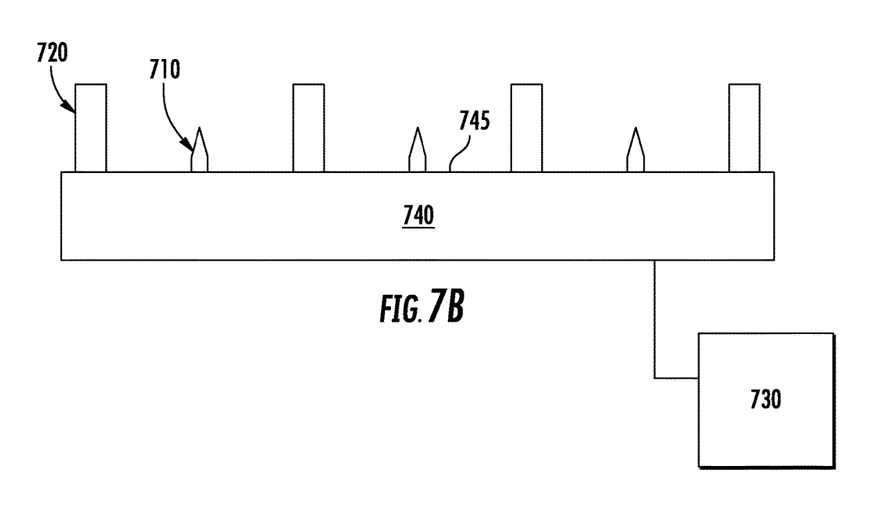

In another embodiment, shown in FIG. 7A, an actuator 730 may be used to move a first subset 710 of the grounding structures above the surface 745 of the platen 740, while retaining a second subset 720 of the grounding structures at a lower level. This insures that the first subset 710 of the grounding structures is used to contact the back surface of the workpiece. The second subset 720 may be at a level below the surface 745 of the platen 740. In another embodiment, the second subset 720 may be above the surface 745 of the platen 740, but below the level of the first subset of grounding structures. FIG. 7B shows a configuration where the second subset 720 is above the surface 745 of the platen 740, while the first subset 710 of the grounding structures is at a lower level. In other words, each subset 710, 720 has a first position and a second position, where the subset of grounding structures extends from the surface 745 to a greater extent in the second position. Therefore, when one subset is in the second position, these grounding structures will extend to a level above the surface of the platen to a greater extent than a second subset in the first position.

The actuator 730 may be in communication with an actuating member, such as a solenoid, a pneumatic component, a plate, a linkage, or another suitable device. These actuating members serve to move the first subset 710 and the second subset 720 of grounding structures. The actuator may include a linkage or a flexure on which the grounding structures are mounted. The flexure might be a ring, a multi pointed star shape, or another azimuthally periodic structure that would allow access to the locations of the grounding structures. The flexure could be driven or actuated by any of a number of methods, such as pneumatics, a solenoid, gas filled bellows, a linkage to a rotary actuator, a cam system, or other mechanisms.

In one embodiment, there are exactly two subsets. A single actuator may be used to control both subsets, using two settings. In the first setting, the first subset 710 is lifted to the second position, while the second subset 720 is lowered to the first position. In the second setting, the second subset 720 is lifted to the second position while the first subset 710 is lowered to the first position. Note that in this embodiment, there are exactly two configurations of grounding structures, as exactly one of the first subset or second subset is in the second position, while the other subset is in the first position.

In a second embodiment, a single actuator independently controls the movement of the first subset 710 and the second subset 720. In other words, the first subset 710 may be moved between the first and second positions independently of the second subset 720. In the case of two subsets, this allows three configurations of grounding structures; a first configuration where the first subset 710 is in contact with the workpiece, a second configuration where the second subset 720 is in contact with the workpiece and a third configuration where both subsets 710, 720 are in contact with the workpiece. In a variation of this embodiment, more than two subsets may be employed. Greater numbers of subsets may allow more flexibility in selecting an appropriate grounding configuration for a particular type of workpiece.

Furthermore, while one actuator is described above, more than one actuator may be employed. For example, each subset 710, 720 may have a dedicated actuator. In another embodiment, two or more subsets may share an actuator. Thus, in the case of two subsets, one actuator may be in communication with both subsets. In another embodiment, a first actuator may be in communication with the first subset 710 and a second actuator, different than the first actuator, may be in communication with the second subset 720.

The subsets 710, 720 may be configured in any desired manner. For example, in one embodiment, each subset may comprise only grounding structures of the same type, such as grounding pins, flat-end posts or mushroom-shaped grounding structures. In another embodiment, a subset may comprise all of the grounding structures that are appropriate for a particular type of workpiece. For example, a first subset of grounding structures may be suitable for workpieces with a native oxide layer, a second subset of grounding structures may be suitable for workpieces with a grown oxide layer, and a third subset of grounding structures may be suitable for workpieces with a nitride layer or a non-uniform layer.

While each subset is a unique combination of grounding structures, it is not necessary that each grounding structure be part of only a single subset. In other words, a single grounding structure may be part of more than one subset. For an example, a first subset may comprise all of the grounding pins, for use with workpieces with a native oxide layer. A second subset may comprise all of the flat-end posts, for use with workpieces with a grown oxide layer. A third subset may comprise the grounding pins located near the center of the platen and the flat-end posts located near the outer edge of the platen. Thus, some of the grounding pins may be part of the first subset and the third subset, while some of the flat-end posts may be part of the second subset and the third subset.

Other subsets may also be created. The use of multiple subsets allows the selection of a particular type of grounding structure in a particular region of the workpiece. For example, a subset may comprise a first type of grounding structures and a second type of grounding structures. In a further embodiment, the first type of grounding structures may be disposed in a specific region of the platen, while the second type of grounding structures is disposed in a different region of the platen. In one particular embodiment, as described above, the first type of grounding structures may be grounding pins, and the second type may be grounding structures having a flat end. In one particular embodiment, a subset comprising grounding pins located near the center of the platen and flat-end posts located near the outer edge may be appropriate with workpieces that have thicker coatings near the outer edge or periphery. However, other embodiments are also possible. In another embodiment, grounding pins may be located near the outer edge while flat-end posts are located near the center of the platen. This configuration may be useful if the coating on the back surface is thicker near the center of the workpiece. Thus, the use of multiple subsets allows a particular type of grounding structure to be used in a specific region of the workpiece, which maximizes the flexibility and usefulness of the platen.

Additionally, a subset may be any number of grounding structures. In one embodiment, each grounding structure is an independently controllable subset, allowing maximum flexibility in creating grounding configurations. In other embodiments, more than one grounding structure is grouped together in an independently controllable subset.

The plurality of grounding structures and subsets can be used on a variety of different platens. For example, in one embodiment, the grounding structure configuration described herein can be employed with an electrostatic clamp, where electrical fields are used to clamp the workpiece to the platen. In another embodiment, the multiple grounding structures may be used with other types of platens. In other devices that require charge management, this same multiplicity of grounding structures may be beneficial. Any process that exposes the workpiece to ions, or could create a charge on the workpiece, could potentially benefit from this arrangement of grounding structures.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A platen for holding a workpiece, comprising: a surface on which said workpiece is disposed; a plurality of grounding structures, comprising a first subset of grounding structures; and a second subset of grounding structures, said second subset different from said first subset, wherein the plurality of grounding structures comprises grounding pins having a tapered end configured to penetrate a back surface of said workpiece, and grounding structures having a flat end configured to contact said back surface; and an actuator, in communication with said first subset of grounding structures, to move said first subset of grounding structures from a first position where said first subset does not contact said back surface of said workpiece to a second position where said first subset is extended above said surface so as to contact said back surface, and also in communication with said second subset of grounding structures, to move said second subset from a first position where said second subset does not contact said back surface of said workpiece to a second position where said second subset is extended above said surface so as to contact said back surface.

2. The platen of claim 1, wherein said second position of said first subset of grounding structures extends above said surface to a greater extent than said first position of said second subset of grounding structures, and said second position of said second subset of grounding structures extends above said surface to a greater extent than said first position of said first subset of grounding structures.

3. The platen of claim 1, wherein said actuator independently moves said first subset of grounding structures and said second subset of grounding structures.

4. The platen of claim 1, wherein said actuator moves said first subset of grounding structures to said first position while moving said second subset of grounding structures to said second position.

5. The platen of claim 1, wherein said first subset of grounding structures comprises only grounding pins having a tapered end configured to penetrate said back surface of said workpiece.

6. The platen of claim 1, wherein said second subset of grounding structures comprises only grounding structures having a flat end configured to contact said back surface.

7. The platen of claim 1, wherein said first subset of grounding structures and said second subset of grounding structures are each configured for a particular type of workpiece.

8. The platen of claim 7, wherein said first subset of grounding structures comprises grounding pins having a tapered end configured to penetrate said back surface of said workpiece, and also comprises grounding structures having a flat end configured to contact said back surface.

9. The platen of claim 8, wherein said grounding pins are disposed in a specific region of said platen, and said grounding structures having a flat end are disposed in a different region of said platen.

10. A platen for holding a workpiece, comprising:
a surface on which said workpiece is disposed; a plurality of grounding structures, comprising a first subset of grounding structures; and a second subset of grounding structures, said second subset different from said first subset, wherein the plurality of grounding structures comprises grounding pins having a tapered end configured to penetrate a back surface of said workpiece, and grounding structures having a flat end configured to contact said back surface; a first actuator, in communication with said first subset of grounding structures, to move said first subset of grounding structures from a first position where said first subset does not contact a back surface of said workpiece to a second position where said first subset is extended above said surface so as to contact said back surface; and
a second actuator, in communication with said second subset of grounding structures, to move said second subset from a first position where said second subset does not contact said back surface of said workpiece to a second position where said second subset is extended above said surface so as to contact said back surface.

11. The platen of claim 10, wherein said first subset of grounding structures comprises only grounding pins having a tapered end configured to penetrate said back surface of said workpiece.

12. The platen of claim 10, wherein said second subset of grounding structures comprises only grounding structures having a flat end configured to contact said back surface.

13. The platen of claim 10, wherein said first subset of grounding structures and said second subset of grounding structures are each configured for a particular type of workpiece.

14. The platen of claim 13, wherein said first subset of grounding structures comprises grounding pins having a tapered end configured to penetrate a back surface of said workpiece, and grounding structures having a flat end configured to contact said back surface.

15. The platen of claim 14, wherein said grounding pins are disposed in a specific region of said platen, and said grounding structures having a flat end are disposed in a different region of said platen.

16. The platen of claim 10, wherein at least one grounding structure is part of said first subset of grounding structures and said second subset of grounding structures.

* * * * *